(12) United States Patent
Caron et al.

(10) Patent No.: US 8,629,562 B2
(45) Date of Patent: Jan. 14, 2014

(54) TECHNIQUES FOR MODULAR CHIP FABRICATION

(75) Inventors: Alain Caron, South Burlington, VT (US); John Ulrich Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/600,716

(22) Filed: Aug. 31, 2012

(65) Prior Publication Data

US 2012/0326321 A1 Dec. 27, 2012

Related U.S. Application Data

(60) Continuation of application No. 13/013,517, filed on Jan. 25, 2011, now Pat. No. 8,288,866, which is a division of application No. 11/929,335, filed on Oct. 30, 2007, now Pat. No. 7,892,885.

(51) Int. Cl.
*H01L 23/48* (2006.01)

(52) U.S. Cl.
USPC ........... 257/770; 257/774; 257/741; 257/723; 257/E23.011; 438/107; 438/109; 438/111

(58) Field of Classification Search
USPC ........... 257/770, 774, 741, 723, 724, E23.11, 257/E23.011; 438/107, 109, 111
See application file for complete search history.

(56) References Cited

U.S. PATENT DOCUMENTS

| 5,391,917 | A | 2/1995 | Gilmour et al. |
|---|---|---|---|
| 5,977,640 | A | 11/1999 | Bertin et al. |
| 6,150,724 | A | 11/2000 | Wenzel et al. |
| 6,268,660 | B1 | 7/2001 | Dhong et al. |
| 6,610,934 | B2 | 8/2003 | Yamaguchi et al. |
| 6,828,606 | B2 * | 12/2004 | Glebov .......................... 257/244 |
| 7,041,516 | B2 | 5/2006 | Rajagopalan et al. |
| 7,324,352 | B2 * | 1/2008 | Goodwin ...................... 361/803 |
| 2002/0094603 | A1 * | 7/2002 | Isaak ............................. 438/107 |
| 2002/0112496 | A1 | 8/2002 | Bash et al. |
| 2003/0049886 | A1 | 3/2003 | Salmon |
| 2004/0150095 | A1 | 8/2004 | Fraley et al. |
| 2004/0232248 | A1 | 11/2004 | Cho |
| 2005/0121768 | A1 | 6/2005 | Edelstein et al. |
| 2006/0050488 | A1 * | 3/2006 | Goodwin ....................... 361/749 |
| 2008/0164573 | A1 | 7/2008 | Basker et al. |
| 2008/0179755 | A1 | 7/2008 | Andry et al. |

OTHER PUBLICATIONS

R. Dennard et al., "Design of ion-implanted MOSFETs with very small physical dimensions," IEEE Journal of Solid State Circuits, vol. SC-9, No. 5, pp. 256-268 (Oct. 1974).

J.U. Knickerbocker et al., "Development of Next-Generation System-On-Package (SOP) Technology Based On Silicon Carriers With Fine-Pitch Chip Interconnection," IBM J. Res. & Dev., vol. 49, No. 4/5, pp. 725-753 (Jul./Sep. 2005).

* cited by examiner

*Primary Examiner* — Thinh T Nguyen
(74) *Attorney, Agent, or Firm* — Vazken Alexanian; Michael J. Chang, LLC

(57) ABSTRACT

Techniques for modular chip fabrication are provided. In one aspect, a modular chip structure is provided. The modular chip structure comprises a substrate; a carrier platform attached to the substrate, the carrier platform comprising a plurality of conductive vias extending through the carrier platform; and a wiring layer on the carrier platform in contact with one or more of the conductive vias, wherein the wiring layer comprises one or more wiring levels and is configured to divide the carrier platform into a plurality of voltage islands; and chips, chip macros or at least one chip in combination with at least one chip macro assembled on the carrier platform.

14 Claims, 5 Drawing Sheets

100

400

500

600

700

United States Patent US 8,629,562 B2

TECHNIQUES FOR MODULAR CHIP FABRICATION

CROSS-REFERENCE TO RELATED APPLICATIONS

This application is a continuation of U.S. application Ser. No. 13/013,517 filed on Jan. 25, 2011, now U.S. Pat. No. 8,288,866, which is a divisional of U.S. patent application Ser. No. 11/929,335, filed on Oct. 30, 2007, now U.S. Pat. No. 7,892,885, the contents of which are incorporated by reference herein.

FIELD OF THE INVENTION

The present invention relates to chip design, and more particularly, to modular chip structures and methods for fabrication thereof.

BACKGROUND OF THE INVENTION

When developing new chip designs, it is common for chip designers to combine pre-designed components to form the new chip. This modular chip fabrication process is beneficial as it takes advantage of preexisting proven technology. For example, a chip designer might combine components from several different previously developed chips.

The computer chip industry is constantly developing and employing process technologies to produce chips having smaller feature sizes. For example, the achievable feature size of about three micrometers ($\mu$m) (or 3,000 nanometers (nm)) in 1976 was reduced to about 90 nm in 2003. Smaller feature sizes allow for a greater number of functionalities to be associated with a given chip, and thus generations of chip scaling have followed scaling laws first set forth by R. Dennard et al., "Design of ion-implanted MOSFETs with very small physical dimensions," *IEEE Journal of Solid State Circuits*, vol. SC-9, no. 5, pp. 256-268 (October 1974). Further, chips with smaller feature sizes require less power to operate. With an estimated $2.7 billion spent in 2005 to run servers and other associated computer equipment in the United States alone, power consumption is a growing concern.

These rapid advances in chip scale technology, however, can have notable drawbacks with regard to modular chip fabrication. Namely, as chip technology changes, incompatibilities can often arise between the 'old' and the 'new' technologies. By way of example only, a change in chip feature size typically coincides with a change in power requirements. Different power requirements can render one component incompatible with another component. Thus, the versatility of current chip design technology can be limited unless all of the components are redesigned into the latest node for a new chip and fabricated using the scaled down features associated with the latest node of semiconductor wafers.

Therefore, modular chip fabrication techniques which improve the compatibility of different chip technologies would be desirable.

SUMMARY OF THE INVENTION

The present invention provides techniques for modular chip fabrication. In one aspect of the invention, a modular chip structure is provided. The modular chip structure comprises a substrate; a carrier platform attached to the substrate, the carrier platform comprising a plurality of conductive vias extending through the carrier platform; and a wiring layer on the carrier platform in contact with one or more of the conductive vias, wherein the wiring layer comprises one or more wiring levels and is configured to divide the carrier platform into a plurality of voltage islands; and chips, chip macros or at least one chip in combination with at least one chip macro assembled on the carrier platform.

In another aspect of the invention, a method of fabricating a modular chip structure is provided. The method comprises the following steps. A carrier wafer is provided. A plurality of conductive vias are formed in the carrier wafer. A wiring layer is formed on the carrier wafer in contact with one or more of the conductive vias, wherein the carrier wafer having the conductive vias and the wiring layer comprises a carrier platform, and wherein the wiring layer is configured to divide the carrier platform into a plurality of voltage islands. Chips, chip macros or at least one chip in combination with at least one chip macro are assembled on the carrier platform. The carrier platform is attached to a substrate to form the modular chip structure.

A more complete understanding of the present invention, as well as further features and advantages of the present invention, will be obtained by reference to the following detailed description and drawings.

DETAILED DESCRIPTION OF PREFERRED EMBODIMENTS

Figure 1:
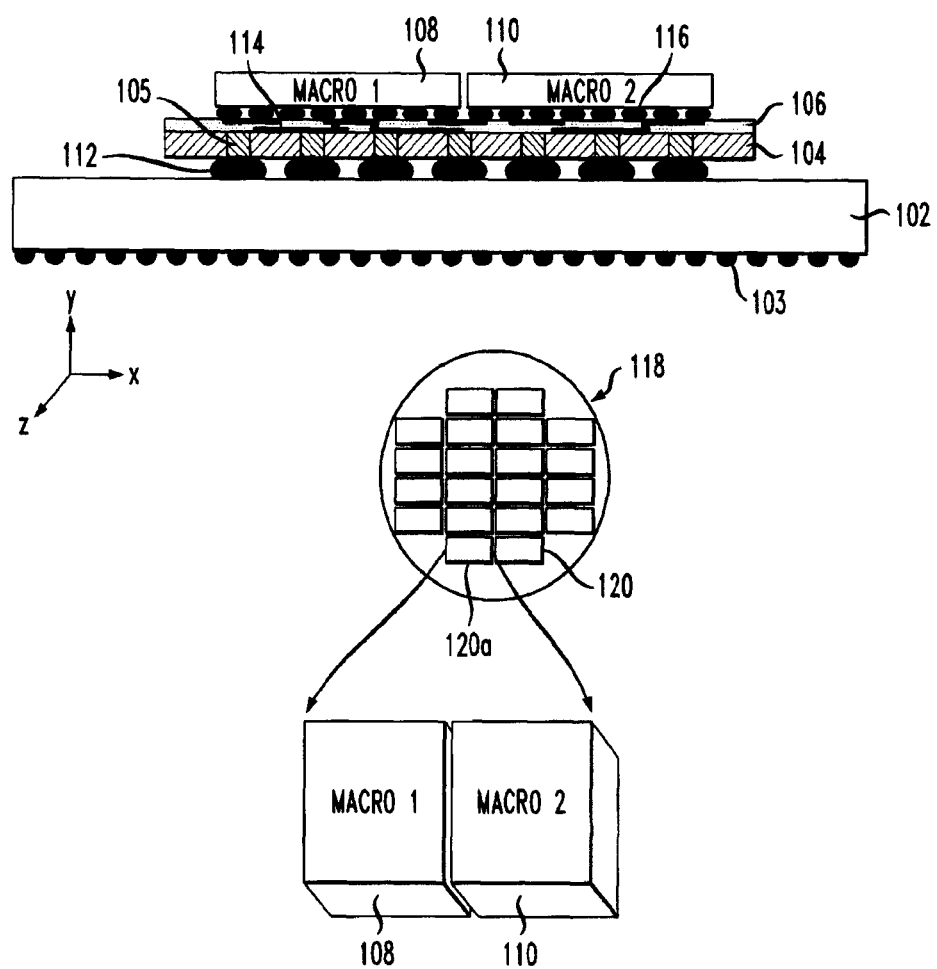
FIG. 1 is a diagram illustrating an exemplary modular chip structure according to an embodiment of the present invention.

FIG. 1 is a diagram illustrating exemplary modular chip structure 100. Modular chip structure 100 may comprise, for example, a modular application specific integrated circuit (ASIC) structure. ASIC refers generally herein to any integrated circuit (chip) designed for a specific application, and includes, for example, custom and standard ASICs, such as system on a chip (SoC) designs.

As will be described in detail below, the present invention provides improved modular chip fabrication techniques that permit one or more pre-designed chip circuits, such as chips and/or chip macros (described below), to be used in modular form in conjunction with newly designed chips and/or chip macros (e.g., which collectively can support a new application) and/or with other pre-designed chips and/or chip macros, e.g., from a different node of semiconductor technology. Namely, the present techniques permit the integration of heterogeneous chip technology, reuse of chip designs and macros and can result in new chip or product designs having shorter net lengths between chips, higher bandwidth, reduced latency periods and reduced power requirements. The integration of heterogeneous chip technology allows for a wider variety of chip technology to be used in new chip design.

Modular chip structure 100 includes substrate 102, carrier platform 104, wiring layer 106 and two or more chip macros, i.e., chip macros 108 and 110, assembled on carrier platform 104 in a single layer configuration. A variety of materials are suitable for forming substrate 102. These materials include, but are not limited to, one or more of organic materials, e.g., core and build-up materials such as GX-13 or other suitable polymer-based dielectric build-up materials, glass materials, ceramic materials, e.g., low temperature co-fire ceramic (LTCC) materials, glass-ceramic materials, alumina and semiconductor materials, e.g., silicon (Si) or Si germanium (SiGe).

The selection of a material for forming substrate 102 is based, at least in part, on a coefficient of thermal expansion (CTE) of that material in relation to a size of carrier platform 104 (measured, for example, as one half of a diagonal of carrier platform 104 when carrier platform 104 is square (often referred to as the distance from neutral point (DNP)), a CTE of carrier platform 104, a standoff height for interconnection (i.e., an interconnection height) between substrate 102 and carrier platform 104 and/or a size of the interconnects, i.e., attachment points 112 (described below), between substrate 102 and carrier platform 104 (measured, for example, as a diameter of each of the attachment points 112). By way of example only, if the diagonal of carrier platform 104 is about 25 millimeters (mm), a CTE material of about 18 parts per million per degrees Celsius (ppm/° C.) can be used for substrate 102 at a standoff height of about 75 micrometers (µm) and an average interconnect size of about 100 µm. If the size of carrier platform 104 is increased (e.g., to a diagonal of about 50 mm), if the standoff height is decreased (e.g., to between about two µm and about 20 µm) and/or if the average interconnect size is decreased (e.g., to between about two µm and about 20 µm), a material having a CTE of between about three ppm/° C. and about 12 ppm/° C. may be employed for substrate 102 to more closely match the CTE of a Si-based carrier platform (in order to maintain proper electrical contact between substrate 102 and carrier platform 104, even if the structure undergoes multiple thermal excursions).

The CTE of substrate 102 can be altered by changing the material and/or by changing the composition of the material. For example, one or more of copper-invar-copper (CIC) core and carbon fiber can be added to organic substrate materials to alter the CTE of substrate 102. Other factors which can impact the CTE of substrate 102 include a thickness of substrate 102 and its modulus. According to an exemplary embodiment, substrate 102 has a thickness of less than or equal to about 10 mm, e.g., between about one mm and about 10 mm.

As shown in FIG. 1, substrate 102 comprises attachment points 103. Attachment points 103 can be made using any suitable bonding method(s) and/or material(s) that produce a conductive bond between electrical interconnection pads (not shown) on the substrate and corresponding interconnection pads on a board or card (not shown) to which the modular chip structure is attached. Suitable bonding method(s) and/or material(s) include, but are not limited to, solder bonding, such as with ball grid arrays (BGAs) and column grid arrays (CGAs), and by means of a socket or land grid array and associated pressure contact/metallurgy, such as a spring and/or conductive pad(s). According to the exemplary embodiment shown in FIG. 1, attachment points 103 comprise a plurality of large solder connections or BGAs which can be connected to a board or card through a surface mount reflow using a solder, such as tin-lead (PbSn) eutectic solder (with a melting point of about 183 degrees Celsius (° C.) and a reflow temperature of about 220° C.) and/or a tin-silver-copper (SnAgCu) (SAC) solder (with a melting point of about 217° C. and a reflow temperature of less than about 260° C.).

Substrate 102 provides the necessary signal, power and ground input/output connections to carrier platform 104 (described below). A single substrate can support one, or more than one, modular chip structure. Therefore, according to an alternative embodiment, multiple modular chip structures share a common substrate.

Carrier platform 104 can comprise any suitable semiconductor material, including, but not limited to Si, SiGe and gallium arsenide (GaAs). According to an exemplary embodiment, carrier platform 104 is a Si carrier or wafer and has a thickness of less than or equal to about 250 µm, e.g., between about five µm and about 250 µm.

As shown in FIG. 1, carrier platform 104 comprises a plurality of conductive vias 105 extending therethrough. Conductive vias 105 comprise an electrical conductor, such as tungsten (W), copper (Cu), nickel (Ni), doped-polysilicon or a composite conductor. By way of example only, conductive vias 105 can be formed in carrier platform 104 using a "vias first" process approach, wherein deep blind vias are etched into carrier platform 104, a dielectric (e.g., a thermal oxide) is created, an interface (e.g., a titanium-titanium nitride (Ti/TiN) alloy or a tantalum-tantalum nitride (Ta/TaN) alloy) can be deposited and then the vias can be completely filled with the electrical conductor material. Wiring layer 106 is formed in, or placed on, a top surface of carrier platform 104 (as described below) and then the blind vias are converted to through-vias by thinning carrier platform 104 using backside grinding and/or etching to expose the electrical conductor material on a backside. An alternative "vias first" approach or "vias intermediate" approach would be to first etch the vias and create the dielectric, then use a polysilicon fill to preserve the vias while active circuits and/or passive function are formed. Once the active circuits and/or passive function have been formed, the polysilicon fill is removed and the vias are refilled with a low resistance conductor, such as W or Cu. With either of the above approaches, additional wiring (i.e., in addition to wiring layer 106) can be added to the top surface of carrier platform 104, either before or after the conductive vias are formed, and/or to the backside of carrier platform 104 after the backside grinding and/or etching.

Alternatively, a "vias last" approach can be used wherein active circuits and/or passive function are formed, and wiring layer 106 is formed in, or placed on, the top surface of carrier platform 104. The through-vias are then added at the end of the process by driving them through from the backside of carrier platform 104. Various techniques for forming vias are described in detail, for example, in U.S. Pat. No. 6,268,660 issued to Dhong et al., entitled "Silicon Packaging With Through Wafer Interconnects," and in U.S. Patent Application Number 2005/0121768 filed by Edelstein et al., entitled "Silicon Chip Carrier With Conductive Through-Vias and Method for Fabricating Same," the contents both of which are incorporated herein by reference.

Carrier platform 104 is bonded to substrate 102, i.e., at attachment points 112. Attachment points 112 can be made using any suitable bonding method(s) and/or material(s) that produce a conductive electrical interconnection. Suitable bonding method(s) and/or material(s) include, but are not limited to, copper-to-copper (Cu-to-Cu) bonding, solder bonding and conductive adhesive bonding. Each of these electrical interconnections can benefit from additional adhesive bonding for improved reliability and reduced corrosion, such as with the use of epoxy adhesives and/or high temperature adhesives, e.g., polyimide-based adhesives. When attachment points 112 comprise solder bonds, suitable solders for forming attachment points 112 include, but are not limited to, lead-based solders, such as PbSn (37 percent (%)/63% eutectic) solders, PbSn (97%/3% or 95%/5% high melt) solders and lead-free solders, such as SnAgCu (greater than 95% Sn, less than 5% Ag, balance Cu) solders, tin-silver (SnAg) solders, tin-copper (SnCu) solders, indium-nickel (InNi) solders, Cu solders.

As shown in FIG. 1, attachment points 112 are positioned relative to conductive vias 105, so as to form multiple electrical paths, i.e., inputs/outputs, between substrate 102 and wiring layer 106 (described below). These electrical paths can serve as signal lines providing connections between circuits and/or as voltage and ground paths, i.e., providing power and ground connections, respectively. Regarding power and ground connections, different electrical paths can be used to provide connections to different voltage grids which can be segmented to provide appropriate voltage to specific circuits, depending on voltage specifications. Further, voltage regulation circuits can be incorporated into carrier platform 104 to alter voltage levels, i.e., power levels, and/or provide switches to power on and off macros and/or circuits within a macro, or one or more processors within a multicore processor.

As will be described in detail below, carrier platform 104 can comprise a single carrier wafer structure on which the chip macros are assembled. Alternatively, carrier platform 104 can comprise one or more individual carriers (to which the chip macros are bonded) that are assembled on the surface of the carrier wafer structure.

Wiring layer 106 is present on a side of carrier platform 104 opposite substrate 102 and adjacent to the chip macros. For ease of depiction, a single wiring layer 106 is shown in FIG. 1. However, it is to be understood that multiple wiring layers can be employed. According to one exemplary embodiment, wiring layer 106 is formed as an integral part of carrier platform 104. Namely, wiring layer 106 is formed on a surface of carrier platform 104 using standard back end of line (BEOL) patterning techniques to form signal, power and ground wiring. For example, a wiring pattern is created using resist, lithography, etching, plating, chemical-mechanical polishing and dielectric depositions or damascene processes. Thus one or more levels of BEOL processing can provide for a plurality of connections, e.g., connections 114 along X, Y and Z planes, using a conductor such as Cu or aluminum (Al) on the surface of carrier platform 104. As described above, the formation of wiring layer 106 on carrier platform 104 can occur in sequence with the formation of conductive vias 105 based on, e.g., a "vias first," a "vias intermediate" or a "vias last" approach.

According to an alternative embodiment, wiring layer 106 can be formed separately from the carrier platform. For example, wiring layer 106 can be formed by etching a wiring pattern into a separate wiring layer wafer(s) (not shown). Then, during assembly of the modular chip structure, the wiring layer wafer(s) is mated to the carrier platform using wafer bonding techniques, to form one integrated carrier platform having a wiring layer. In this example, the wiring layer wafer(s) could be added to the top surface and/or backside of the carrier platform.

Advantageously, according to this approach, the wiring layer wafer(s) can comprise larger-sized wires than those that can be located in a wiring layer formed as an integral part of the carrier platform 104 (as described above). For example, the wiring layer wafer(s) can comprise Cu wires (formed in an etched inorganic or polyimide base) with a thickness of, e.g., up to about 50 μm, and a width of, e.g., up to about 75 μm, which are well suited for applications wherein low electrical resistance and/or high current carrying capacity are desired, such as for voltage grids and/or for longer signal wires. The wiring layer wafer(s) can also accommodate multiple wiring levels interconnected by conductive vias.

According to an exemplary embodiment, the wiring layer wafer(s) incorporates both BEOL (small wiring sizes, e.g., up to about 20 μm) and larger-sized wires, to further increase the versatility of the modular chip design and chip design process integration. This integration of BEOL and larger-sized wires permits chip and module level integration without wafer bow process limitations traditionally observed for large conductor feature sizes. The use of larger-sized wires further also permits use of low cost wiring and via processes, and permits alignment-bonding of the wiring layer wafer(s) to the carrier platform with high yields. According to an exemplary embodiment, the wiring layer wafer(s) is bonded to the carrier platform using one or more of solder and Cu-to-Cu bonding.

As such, various wiring layer wafers can be pre-fabricated having different wiring configurations. During the assembly process, the wiring layer wafers can be mated to different carrier platforms depending on the particular application. This approach greatly increases the number of different possible combinations of wiring layers with, e.g., vias patterns, in the carrier platform.

As mentioned above, wiring layer 106 comprises a plurality of connections 114. According to the present teachings, the arrangement/placement of connections 114 is configured to divide carrier platform 104 into one or more voltage islands (voltage segmentation). For example, connections 114 can be patterned into a plurality of individual segments, each segment being configured to provide a different power and ground input/output to one or more of the chip macros (described below). By way of example only, each segment can be supplied power, or unique power level, through a separate dedicated power feed or integrated voltage regulator(s). Switches can be employed to route the power supply to one or more of the segments, decouple one or more of the segments from the other segments and/or turn specific segments on or off (thus conserving power). By way of example only, the modular chip structure can comprise a multi-core processor wherein one or more of the processor cores can be selectively turned off, as described, depending on operating requirements. Selectively powering certain segments can serve to decrease the overall power consumption of the device by providing power to only those active segments requiring it. This can provide a significant power cost savings, as compared to configurations wherein the entire structure is powered continuously.

Chip macros 108 and 110 are assembled on carrier platform 104. In the configuration shown in FIG. 1, chip macros 108 and 110 are each bonded to carrier platform 104, i.e., at attachment points 116. Attachment points 116 provide the necessary signal, power and ground input/outputs from wiring layer 106 to chip macros 108 and 110.

As with attachment points 112, attachment points 116 can be made using any suitable bonding method(s) and/or material(s) that produces a conductive electrical interconnection. Suitable bonding method(s) and/or material(s) include, but are not limited to, Cu-to-Cu bonding, solder bonding and conductive adhesive bonding. Each of these electrical interconnections can benefit from additional adhesive bonding for improved reliability and reduced corrosion, such as with the use of epoxy adhesives and/or high temperature adhesives, e.g., polyimide-based adhesives.

Solder bonds, in general, are a favorable mode of forming the various attachment points (input/outputs) described herein. Namely, solder bonds are scalable to meet input/output pitch requirements. The term "input/output pitch," as used herein, refers to the maximum allowable distance between adjacent input/outputs. For example, according to one embodiment of the present invention, attachment points 116 have an input/output pitch of between about 20 μm and about 50 μm, i.e., corresponding to between about 250,000 connections per square centimeter ($cm^2$) and about 40,000 connections per $cm^2$, respectively. As such, reducing the input/output pitch increases the number of connections per unit area. An input/output pitch of between about 20 μm and about 50 μm can be achieved using solder bonds. Results for 50 μm pitch fine-pitch solder bonding have shown that the solder bonds provide a robust and reliable connection with low electron migration, high mechanical strength (i.e., hold up well to mechanical testing) and good thermal conductivity. Assessments with 10 μm diameter contact pads permitting 20 μm pitch also showed good assembly yields. Other bonding techniques, such as Cu-to-Cu bonding and oxide-to-oxide bonding with subsequent etching and conductor interconnection may also provide reliable interconnections which can be scaled to finer pitch for wafer processing.

As will be described in detail below, the bonds formed herein are preferably reversible so as to permit rework, i.e., changing positioning/placement, of various components during assembly and testing of the device (as described below). By way of example only, when the bonds are made using solder bonding, heat can be selectively applied to reverse certain bonds, allowing the associated component to be re-positioned and then re-bonded.

The term "chip macro," as used herein, is intended to generally refer to any one of a number of pre-designed functional circuits, including, but not limited to, pre-designed integrated circuits, microprocessors and nodes. A collection of macros on the present modular chip structure may also be referred to herein as an "integrated chip." As described above, the present techniques permit the integration of heterogeneous chip technology in the chip fabrication and integration processes. By way of example only, heterogeneous chip technology can include chips and/or sub-chip components, such as chip macros, having varying feature sizes and associated power requirements.

The voltage or power consumption of a chip and/or chip macro, in general, decreases with a decrease in feature size. A chip macro, for example, produced using 250 nanometer (nm) or 180 nm process technology (referred to herein as a 250 nm or 180 nm chip macro, respectively) may be designed to have an input/output voltage of 3.5 volts or 1.8 volts, respectively, as compared to a 90 nm, a 65 nm or a 45 nm chip macro, which could have voltage levels of between about 0.5 volts and about one volt. The proportional power levels for these chip macros, as the feature sizes are reduced, scale with the reduced voltage levels. Namely, $P = V \times I$, wherein P is power, V is voltage and I is current. These and other heterogeneous chip technologies can be combined by modular chip structure 100. For example, modular chip structure 100 can be used to integrate 65 nm chip macros with 45 nm chip macros by integrating more than one voltage level. This configuration would provide a power savings, e.g., as compared to circuits employing only 65 nm technology.

By way of example only, chip macro 108 can comprise a 45 nm chip macro and chip macro 110 can comprise a 90 nm chip macro. The differing power requirements of the two chip macros can be accommodated by voltage segmentation of the carrier platform as described above. Namely, each chip macro can be associated with a different voltage island on the carrier platform, permitting a different operating power to be separately and/or selectively provided to each chip macro. As such, a notable benefit of the present teachings is, that as advances are made in chip technology, these advances can be easily and readily integrated with existing technology.

As shown in FIG. 1, chip macros 108 and 110 are assembled on carrier platform 104 in a single layer configuration. Namely, each of chip macros 108 and 110 are bonded directly to carrier platform 104. As will be described in detail below, in some embodiments presented herein, multiple chip macros may be assembled in a stacked configuration.

Top view 118 of carrier platform 104 shows the placement of the chip macros, i.e., chip macros 108 and 110, on a top surface of carrier platform 104, e.g., over wiring layer 106. As mentioned above, the chip macros can be assembled directly on the carrier wafer structure, or alternatively, one or more individual carriers, to which the chip macros are bonded, can be assembled on the surface of the carrier wafer structure. The latter configuration is shown illustrated in top view 118. Namely, carrier platform 104 comprises a plurality of individual carriers 120 bonded to a top surface thereof. Chip macros 108 and 110 are in turn bonded to the same individual carrier, i.e., individual carrier 120a. The use of individual carriers further adds to the versatility of the present techniques. Namely, a number of different chip macro combinations can be pre-fabricated on individual carriers and simple wafer bonding techniques employed to assemble these individual carriers onto the carrier wafer surface. Namely, certain commonly associated chip macros can be assembled together on the same individual carrier, later simplifying the device assembly process. Altering the example provided above, if chip macros 108 and 110 instead have the same power requirements, then chip macros 108 and 110 can be pre-assembled on the same individual carrier (as is shown in FIG. 1) to place both chip macros 108 and 110 within the same voltage segment, i.e., voltage island, on the carrier platform. Further, as will be described in detail below, chip macros may be assembled in a stacked configuration. To reduce the number of steps during production of the device, these stacked chip macros may be prefabricated onto the same individual carrier.

Figure 2:
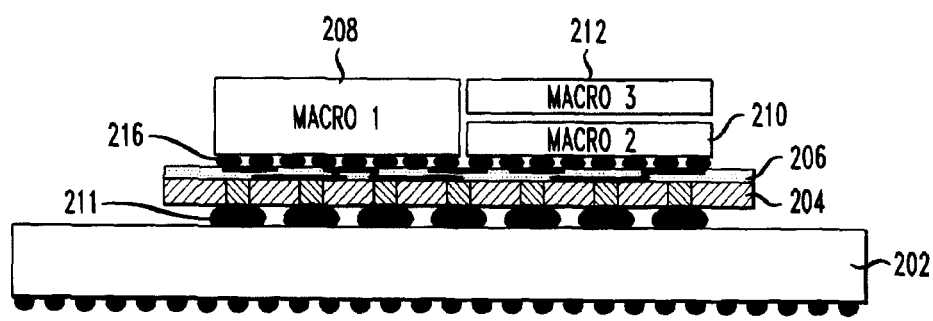
FIG. 2 is a diagram illustrating another exemplary modular chip structure according to an embodiment of the present invention.
Figure 2:
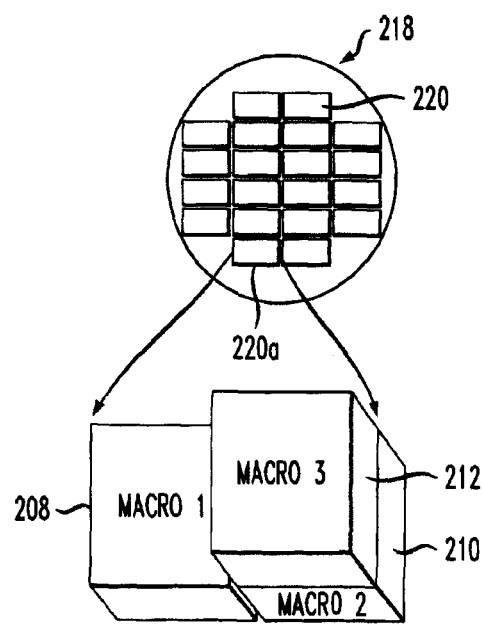

FIG. 2 is a diagram illustrating exemplary modular chip structure 200. Modular chip structure 200 may comprise, for example, a modular ASIC structure. Like modular chip structure 100 described, for example, in conjunction with the description of FIG. 1, above, modular chip structure 200 comprises a substrate, i.e., substrate 202, a carrier platform, i.e., carrier platform 204 (bonded to substrate 202 at attachment points 211), and a wiring layer, i.e., wiring layer 206. Modular chip structure 200, however, integrates three chip macros, i.e., chip macros 208, 210 and 212. As shown in FIG. 2, chip macros 208 and 210 are each bonded directly to carrier platform 204 at attachment points 216. Chip macro 212 is assembled on carrier platform 204 so as to be in a stacked configuration with chip macro 210. Namely, chip macro 212 is bonded to a surface of chip macro 210 opposite carrier platform 204.

Design considerations for placing chip macros in a stacked configuration as compared to a single layer configuration, or vice versa, include providing the proper power, ground and/or signal interconnections in the proper orientations. The attachment points, e.g., between stacked chip macros, can then be formed as described above, for example, using suitable bonding method(s) and/or material(s) such as Cu-to-Cu bonding, solder bonding and conductive adhesive bonding. A stacked configuration may also be referred to herein as a three-dimensional (3D) configuration and a single layer configuration may also be referred to herein as a two-dimensional (2D) configuration.

A stacked configuration can be used to increase the number of chip macros in a given area (density) leading to reduced transmission distances, i.e., smaller net lengths, and thus shorter latency periods, as compared to a device layout wherein all of the chip macros are assembled on the carrier platform in a single layer configuration. As will be described below, the chip macros may be thinned to further increase density.

The present modular chip structure can further comprise low power input/output buffers and/or simple inverter circuits for interconnection between chip macros, that are either in a single layer or stacked configuration, to provide signal interconnection. Power levels between the chip macros are dependent, at least in part, on net length and data rate, and can be less than about two milliwatts (mW) per Gigabits per second (Gbps) (mW/Gbps) per input/output. For example, for data rates of between about one Gbps and about eight Gbps and net lengths (i.e., between transmit and receive circuits) of less than or equal to about 10 mm, e.g., between about two mm and about 10 mm, power for circuit drives may be less than about one mW/Gbps per input/output, e.g., less than about 0.5 mW/Gbps per input/output.

This low operating power is achieved in the present teachings, in part, by configuring the design and architecture of the modular chip structure (i.e., stacked, single layer or a combination of stacked and single layer) with interconnections between circuits having the shortest net lengths possible between transmit and receive circuits. The transmit circuit may be, e.g., a circuit board or card to which the modular chip structure is attached, and the receive circuit may be, e.g., a circuit within one of the chips/chip macros. Employing shorter net lengths minimizes, or in some cases eliminates, the need for additional power consuming circuits, such as repeaters, to propagate signals over greater distances between transmit and receive circuits. This low operating power is also achieved by the present teachings, in part, by integrating newer reduced-scale chip technology, such as 45 nm technology that requires less power to operate (i.e., as compared to the larger predecessor technology) and is in support of sub-threshold voltages for chips, which can operate at less than about one volt when power conservation is important. In some cases, operating power levels of less than about 500 millivolts (mV), e.g., less than about 300 mV, are possible and can support extended battery life for portable electronics or significantly reduce power levels for computing, communications and other chip functions.

Top view 218 of carrier platform 204 shows the placement of the chip macros, i.e., chip macros 208, 210 and 212, on a top surface thereof. As described, for example, in conjunction with the description of FIG. 1, above, the chip macros can be assembled directly on the carrier wafer structure, or alternatively, one or more individual carriers, to which the chip macros are bonded, can be assembled on the carrier wafer structure. The latter configuration is shown illustrated in top view 218. Namely, carrier platform 204 comprises a plurality of individual carriers 220 bonded to a top surface thereof. Chip macros 208, 210 and 212 are in turn bonded to the same individual carrier, i.e., individual carrier 220a.

Figure 3:
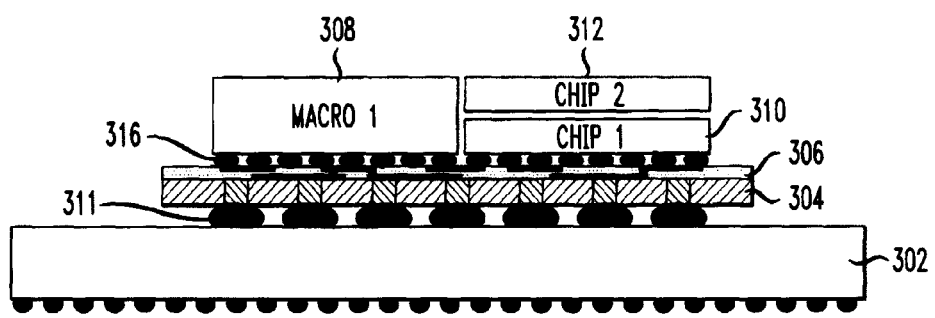
FIG. 3 is a diagram illustrating yet another exemplary modular chip structure according to an embodiment of the present invention.
Figure 3:
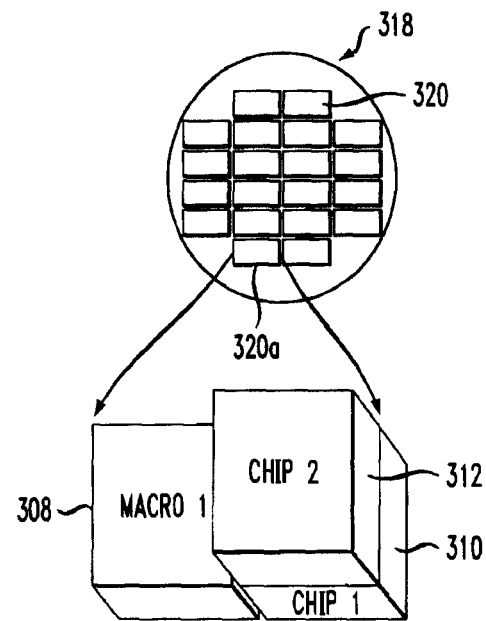

FIG. 3 is a diagram illustrating exemplary modular chips structure 300. Modular chips structure 300 may comprise, for example, a modular ASIC structure. Like modular chips structures 100 and 200 described, for example, in conjunction with the description of FIGS. 1 and 2, respectively, above, modular chips structure 300 comprises a substrate, i.e., substrate 302, a carrier platform, i.e., carrier platform 304 (bonded to substrate 302 at attachment points 311), and a wiring layer, i.e., wiring layer 306. Modular chip structure 300, however, integrates a combination of chips and sub-chip components, i.e., chip macros.

Namely, modular chips structure 300 integrates chip macro 308 with chips 310 and 312. As shown in FIG. 3, chip macro 308 and chip 310 are each bonded directly to carrier platform 304 at attachment points 316. Chip 312 is assembled on carrier platform 304 so as to be in a stacked configuration with chip 310. Design considerations for placing chips in a stacked configuration as compared to a single layer configuration, or vice versa, include providing the proper power, ground and/or signal interconnections in the proper orientations. The attachment points, e.g., between stacked chips, can then be formed as described above, for example, using suitable bonding method(s) and/or material(s) such as Cu-to-Cu bonding, solder bonding and conductive adhesive bonding. Thus, the present modular chip structures provide a versatile platform for integrating heterogeneous chip technology in the form of chip and sub-chip components (chip macros).

It is to be understood that chips 310 and 312 can, alternatively, be assembled on carrier platform 304 in a single layer configuration, with each chip being separately bonded to carrier platform 304. A stacked configuration, however, as described above, can serve to decrease net lengths and advantageously reduce operating power and latency even further.

According to the present teachings, a number of processing steps can be performed on the chips/chip macros before they are assembled on the carrier platform. For example, the chips/chip macros can be thinned. Namely, in one embodiment, each of the chips/chip macros is configured to have a thickness of between about five μm and about 50 μm, and depending on the particular application, a tight tolerance of less than or equal to about ±two μm. Thus, according to this exemplary embodiment, a thickness of any chip or chip macro that exceeds the maximum thickness can be reduced, e.g., via mechanical grinding and/or chemical mechanical polishing (CMP), to be within the specified thickness range. The chips and/or chip macros can also be built from silicon-on-insulator (SOI) wafers each with through Si-vias, as needed, that are within the specified thickness range.

With a stacked configuration, thinning the chips and/or chip macros advantageously permits a greater number of chips and/or chip macros to be placed in a given area (an increase in chip density). As described above, increasing chip density can result in a reduction in net length, reduced latency operation and reduced power consumption.

Further, the chips/chip macros can be processed to ensure precise definition at the edges of the chips/chip macros. Well-defined edges can aid in accurately aligning the chips/chip macros, for example, with the carrier platform during the assembly process (see description of FIG. 5, below). In one embodiment, deep Si etching in combination with oxide, i.e., silicon oxide, or metal crack stops is used to divide up Si wafers into the individual chips/chip macros. The use of deep Si etching serves to thin the edges of the chips/chip macros. Thinned edges can aid in alignment. The use of a crack stop ensures a consistent and precisely defined edge.

Top view 318 of carrier platform 304 shows the placement of chip macro 308 and chips 310 and 312 on a top surface thereof. As described above, the chip macros can be assembled directly on the carrier wafer structure, or alternatively, one or more individual carriers, to which the chip macros are bonded, can be assembled on the carrier wafer structure. The same options are available for bonding chips to the carrier platform. The latter configuration is shown illustrated in top view 318. Namely, carrier platform 304 comprises a plurality of individual carriers 320 bonded to a top surface thereof. Chip macro 308 and chips 310 and 312 are in turn bonded to the same individual carrier, i.e., individual carrier 320a.

Figure 4:
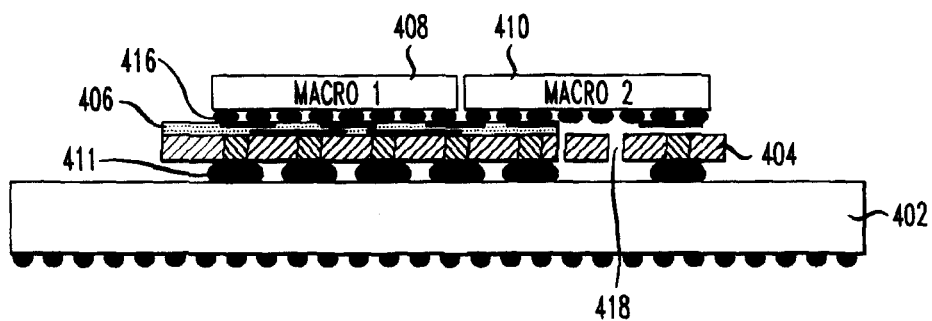
FIG. 4 is a diagram illustrating still another exemplary modular chip structure according to an embodiment of the present invention.

FIG. 4 is a diagram illustrating exemplary modular chip structure 400. Modular chip structure 400 may comprise, for example, a modular ASIC structure. Like modular chip structures 100, 200 and 300 described, for example, in conjunction with the description of FIGS. 1, 2 and 3, respectively, above, modular chip structure 400 comprises a substrate, i.e., substrate 402, a carrier platform, i.e., carrier platform 404 (bonded to substrate 402 at attachment points 411), and a wiring layer, i.e., wiring layer 406. A cavity, i.e., cavity 418, however, is present in carrier platform 404. Cavity 418 can be formed by wafer-level processing of carrier platform 404. Namely, according to an exemplary embodiment, cavity 418 is formed in the carrier platform wafer using deep reactive-ion etching (RIE). For ease of depiction, only a single cavity 418 is shown. However, multiple cavities may be present in carrier platform 404.

Cavity 418 can act as a terminal for an additional modular component(s), such as a passive circuit or another chip macro. For example, as shown in FIG. 4, chip macros 408 and 410 are bonded directly to wiring layer 406 at attachment points 416. A passive circuit, such as a decoupling capacitor, a resistor or a voltage regulator module placed in cavity 418 can also be integrated with modular chip structure 400 at attachment points 416. By way of example only, a voltage regulator module placed within cavity 418 would serve to prevent power surges to chip macro 410. As will be described in detail below, resistors (in conjunction with ground connections) can be employed during assembly and testing of the structure to prevent electrostatic discharges.

Alternatively, if cavity 418 acts a terminal for an additional chip macro, then the additional chip macro can be similarly integrated with modular chip structure 400 at attachment points 416. Placing an additional chip macro in cavity 418 is a functionally identical configuration to stacking the additional chip macro on top of chip macro 410 (see, for example, the stacked chip macro configuration shown in FIG. 2). However, placing chip macros within cavities in the carrier platform helps to further increase the chip macro density, decreasing net lengths and overall power consumption.

Figure 5:
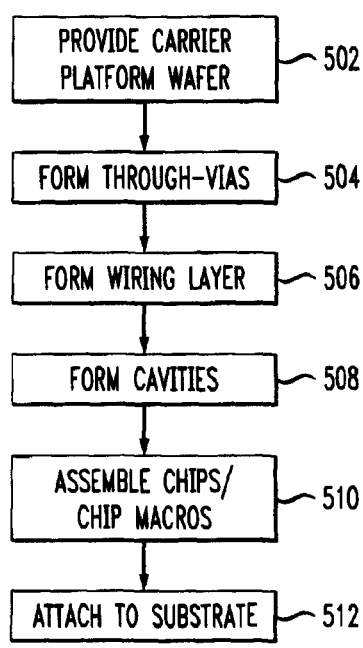
FIG. 5 is a diagram illustrating an exemplary methodology for fabricating a modular chip structure according to an embodiment of the present invention.

FIG. 5 is a diagram illustrating exemplary methodology 500 for fabricating a modular chip structure. In steps 502-508 a carrier platform is synthesized.

Namely, in step 502 a carrier wafer structure is provided. In step 504, one or more through vias are formed in the carrier wafer structure. As described above, the through vias can be formed using one or more of a "vias first," a "vias intermediate" and a "vias last" approach. The best approach for forming the vias is based, for example, on which approach provides the lowest production costs and which approach is compatible with manufacturing.

In step 506, a wiring layer is formed. As described above, the wiring layer can be formed as an integral part of the carrier wafer structure, i.e., patterned into a surface of the carrier wafer structure. Namely, a wiring pattern can be etched into a surface of the carrier wafer structure and the pattern filled with a conductor material, such as Cu, to form a plurality of connections. Alternatively, the wiring layer can be formed separately from the carrier wafer structure. Namely, the wiring pattern can be etched into a wiring layer wafer, the pattern filled with a conductive material and the wiring layer wafer mated to the surface of the carrier wafer structure, e.g., by wafer bonding. In either approach, the wiring layer is positioned such that one or more of the connections are in contact with one or more of the vias. Contact studs/pads can be integrated into the wiring layer to provide attachment points for chip and sub-chip components (see description of step 510, below). For example, Cu studs/pads may be provided to enable Cu-to-Cu bonding with the chips/chip macros, as described below.

In step 508, one or more cavities are formed in the carrier wafer structure. This step is optional. As highlighted above, these cavities can serve as terminals for one or more components, such as passive circuits and/or additional chip macros. As will be described in detail below, the cavities can act as terminals for in-circuit resistors that serve to prevent damage caused by electrostatic discharge during assembly and/or testing of the device. As a result of steps 502-508, a carrier platform is produced.

In step 510, chips and/or chip macros are assembled on the carrier platform. Namely, in step 510, a combination of two or more chips/chip macros are bonded to the carrier platform. As described above, one or more of several suitable bonding method(s) and/or material(s) may be employed. These include, but are not limited to, Cu-to-Cu bonding, solder bonding and conductive adhesive bonding. Each of these bonding method(s) and/or material(s) can benefit from additional adhesive bonding for improved reliability and reduced corrosion, such as with the use of epoxy adhesives or high temperature adhesives, e.g., polyimide-based adhesives.

Cu-to-Cu bonding involves applying heat, e.g., between about 350° C. and about 450° C., and pressure, e.g., between about 100 pounds per square inch (psi) and about 300 psi, to form a contiguous metal bond between Cu studs/pads on the carrier platform and corresponding Cu studs/pads on the chips/chip macros. An additional step may be taken to passivate the joints, wherein the chips/chip macros are underfilled with a polymer material (e.g., materials having a CTE of between about 25 ppm/° C. and about 60 ppm/° C., such as filled polymers, epoxy-based polymers and polyimide-based polymers with Si and/or Al to attain proper CTE), forming a passivation layer between the chips/chip macros and the carrier platform. In addition to reducing the load on the joints (strengthening the bonds), the passivation layer prevents corrosion of the bonds, provides a larger thermal path to enhance heat transfer and helps compensate for mismatches in the CTEs of the connected surfaces.

As described above, the chips/chip macros can either be assembled on the surface of the carrier platform, or placed within one or more of the cavities therein. When assembled on the surface of the carrier platform, the chips/chip macros can be in either a single layer, or a stacked configuration. The stacked chips/chip macros can similarly be bonded to each other using Cu-to-Cu bonding, solder bonding and conductive adhesive bonding, each of which may be supplemented by additional adhesive bonding, e.g., with high temperature adhesives. According to an exemplary embodiment, production scale bonding of the chips/chip macros is performed using an FC 250 Production Device Bonder manufactured by SUSS MicroTec, Garching, Germany.

As described above, according to an alternative embodiment, the chips/chip macros are assembled on the carrier platform in a two-step process. Specifically, the chips/chip macros are first bonded to one or more individual carriers, e.g., using one or more of the Cu-to-Cu bonding, solder bonding and conductive adhesive bonding techniques described above. The individual carriers are then assembled on, and bonded to, the surface of the carrier platform using one or more of the Cu-to-Cu bonding, solder bonding and conductive adhesive bonding techniques described above.

Certain measures can be taken during assembly of the modular chip structure to prevent electrostatic discharge. The discharge of static electricity can damage or destroy integrated circuits. By way of example only, the chips/chip macros can be grounded, i.e., via one or more grounding connections, during assembly onto the carrier platform. These connections can subsequently be broken once assembly is complete. Further, one or more resistors can be integrated into the carrier platform circuitry, e.g., via one or more of the cavities (described above).

In step 512, the carrier platform with assembled chips/chip macros is then bonded to a substrate to form a completed modular chip structure. As described above, the structure has a low operating power, for example, less than about one mW/Gbps per input/output. As a result, as compared to conventional integrated circuit devices, low power input/output drivers can be employed, achieving a lower overall power consumption.

With reference to the above steps for producing a modular chip structure, the present teachings further provide techniques for testing the integration device and its components, e.g., during the assembly process. According to an exemplary embodiment, the chips/chip macros are tested before being assembled onto the carrier platform (see description of step 510, above). Each chip/chip macro to be tested is first grounded via one or more the above-described grounding connections to prevent electrostatic discharge during the testing. Fine-pitch test probes are then used to test the chips/chip macros. According to an exemplary embodiment, full area array test probes are used having a pitch of about 50 μm. For a discussion of test probes, see J. U. Knickerbocker et al., "Development of Next-Generation System-On-Package (SOP) Technology Based On Silicon Carriers With Fine-Pitch Chip Interconnection," IBM J. RES. & DEV., vol. 49, No. 4/5, pps. 725-753 (July/September 2005), the disclosure of which is incorporated by reference herein. The probes can have built-in active circuits that can be used to readily detect any defects in the chips/chip macros. The grounding connections can remain in place during assembly of the chips/chip macros on the carrier platform and/or testing of the assembled structure, as described below, to prevent electrostatic discharge. Testing at this level, i.e., prior to final assembly, greatly saves the time and expense lost in assembling the present modular chip structure using a defective chip/chip macro, only to later find when testing the assembled structure that a defect is present.

The chips/chip macros can then be assembled on the carrier platform (see description of step 510, above) and the assembled structure can be tested. As described above, in addition to the grounding connections to the chips/chip macros, one or more resistors can be integrated into the carrier platform circuitry to prevent electrostatic discharge both during assembly and testing.

Based on the results of the testing, the positioning of one or more of the chips/chip macros can be changed. Namely, as described above, the attachment points provided herein are preferably reversible to permit rework, i.e., changing positioning/placement, of the chips/chip macros. After testing is completed, if not already removed, the grounding connections can be severed.

Figure 6:
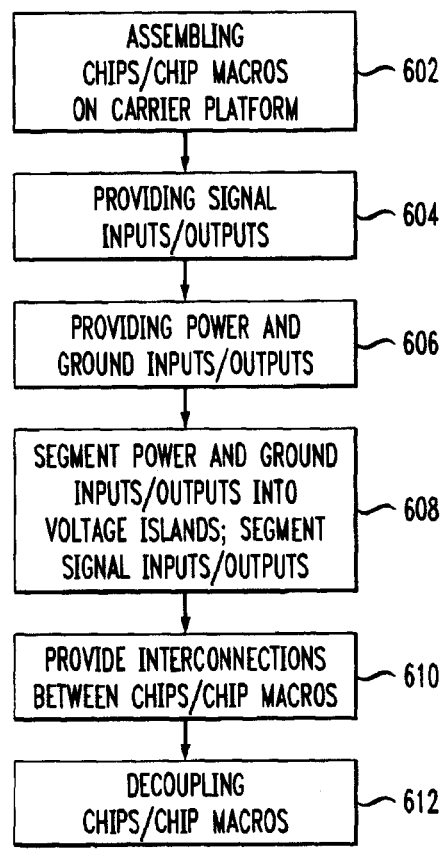
FIG. 6 is a diagram illustrating an exemplary methodology for integrating chips/chip macros according to an embodiment of the present invention.

FIG. 6 is a diagram illustrating exemplary methodology 600 for integrating chips/chip macros. In step 602, the chips/chip macros are assembled on a single carrier platform. A suitable carrier platform includes any one of the carrier platforms described, for example, in conjunction with the description of FIGS. 1-4, above. Namely, the carrier platform can comprise a plurality of conductive vias extending therethrough and a wiring layer on the carrier platform in contact with one or more of the conductive vias. The wiring layer can comprise one or more wiring levels and be configured to divide the carrier platform into a plurality of voltage islands.

In step 604, signal inputs/outputs are provided to each of the chips/chip macros. The signal inputs/outputs can include a combination of the attachment point(s), the conductive via(s) and the wiring layers described above. By way of example only, a combination of one or more of the attachment points 103, 112 and 116 (linked by the conductive vias 105/wiring layer 106) of modular chip structure 100 described in conjunction with the description of FIG. 1, above, can comprise a signal input to and/or a signal output from chip macro 108.

In step 606, power and ground inputs/outputs are provided to each of the chips/chip macros. As in step 604, above, the power and ground inputs/outputs can include a combination of the attachment point(s), the conductive via(s) and the wiring layers described above. By way of example only, a combination of one or more of the attachment points 103, 112 and 116 (linked by the conductive vias 105/wiring layer 106) of modular chip structure 100 described in conjunction with the description of FIG. 1, above, can comprise a power input to and/or a ground output for chip macro 108.

In step 608, the power and ground inputs/outputs provided to some of the chips/chip macros (see, for example, step 606, above) are segmented from the power and ground inputs/outputs provided to other chips/chip macros. By way of example only, with reference to the power and ground inputs/outputs of modular chip structure 100, that are described, e.g., in step 606 above, wiring layer 106 can be configured to segment the power and ground inputs/outputs provided to chip macro 108 from those provided to chip macro 110. This segmentation of power and ground inputs/outputs results in the formation of a plurality of voltage islands, as described above. The voltage islands permit the integration of chips/chip macros having different operating powers from each other (see below).

Similarly, the signal inputs/outputs provided to some of the chips/chip macros (see, for example, step 604, above) can also be segmented from the signal inputs/outputs provided to other chips/chip macros. By way of example only, with reference to the signal inputs/outputs of modular chip structure 100, that are described, e.g., in step 604 above, wiring layer 106 can be configured to segment the signal inputs/outputs provided to chip macro 108 from those provided to chip macro 110.

In step 610, interconnections can be provided between the chips/chip macros. These interconnections can comprise power and ground and/or signal interconnections. As described above, the chips/chip macros can be assembled on the carrier platform in a stacked and/or single layer configuration. By way of example only, power and ground/signal interconnections can be provided between chips/chip macros that are in a stacked configuration with one another.

In step 612, some chips/chip macros can be decoupled from other chips/chip macros. According to an exemplary embodiment, this selective decoupling can be accomplished using the segmentation of power/ground and signal inputs/outputs as described above. Namely, the segments can be operated independently from one another (see below).

Figure 7:
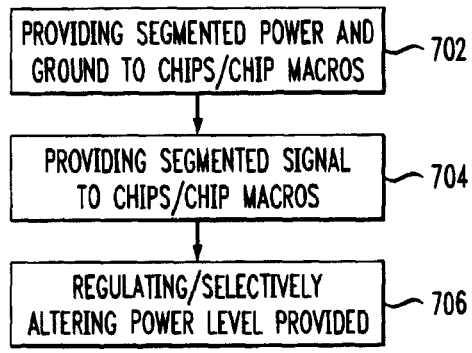
FIG. 7 is a diagram illustrating an exemplary methodology for operating chips/chip macros integrated on a carrier platform according to an embodiment of the present invention.

FIG. 7 is a diagram illustrating exemplary methodology 700 for operating chips/chip macros integrated on a carrier platform. A suitable carrier platform includes any one of the carrier platforms described, for example, in conjunction with the description of FIGS. 1-4, above. Namely, the carrier platform can comprise a plurality of conductive vias extending therethrough and a wiring layer on the carrier platform in contact with one or more of the conductive vias. The wiring layer can comprise one or more wiring levels and be configured to divide the carrier platform into a plurality of voltage islands.

In step 702, power and ground are provided to the chips/chip macros. The power and ground provided are segmented such that, for example, different power levels are provided to different segments, i.e., to different voltage islands, (e.g., to permit integration of chips/chip macros having different operating power levels from each other) and/or power and ground are provided only to select voltage islands (and thereby selectively activating only those chips/chip macros associated with the select voltage islands). Providing power and ground only to select voltage islands can be performed to conserve power and/or to selectively decouple the chips/chip macros associated with the select voltage islands from those chips/chip macros not associated with the select voltage islands. This power and ground segmentation can be accomplished, for example, by segmenting the power and ground inputs/outputs as described, e.g., in conjunction with the description of FIG. 6, above.

In step 704, a signal(s) is provided to the chips/chip macros. The signal(s) provided can also be segmented such that, for example, different signals can be provided to different segments. This signal segmentation can be accomplished, for example, by segmenting the signal inputs/outputs as described, e.g., in conjunction with the description of FIG. 6, above.

In step 706, with regard to the supplied power and ground, a power level provided to one or more of the chips/chip macros can be regulated. Namely, according to an exemplary embodiment, the power level provided to certain voltage islands is regulated and selectively altered depending on the particular needs of an application. For example, when not in use, the power level provided to a particular voltage island can be altered, e.g., reduced, to extend battery life.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A modular chip structure comprising:
    a substrate;
    a carrier platform attached to the substrate, the carrier platform comprising:
        a plurality of conductive vias extending through the carrier platform; and
        a wiring layer on the carrier platform in contact with one or more of the conductive vias, wherein the wiring layer comprises one or more wiring levels and is configured to divide the carrier platform into a plurality of voltage islands; and
    a plurality of pre-designed chip circuits selected from the group consisting of chips, chip macros, chips in combination with at least one chip macro and chip macros in combination with at least one chip assembled on the carrier platform, wherein the carrier platform comprises at least one cavity therein configured to serve as a terminal for one or more of a passive circuit, a decoupling capacitor, a resistor, a voltage regulator module and an additional chip macro, and
    wherein the plurality of conductive vias provides: i) one or more power and ground inputs and outputs to each of the pre-designed chip circuits through the carrier platform, and ii) one or more signal inputs and outputs to each of the pre-designed chip circuits through the carrier platform, wherein the wiring layer is configured to segment the power and ground inputs and outputs to one or more of the pre-designed chip circuits from the power and ground inputs and outputs to at least one other of the pre-designed chip circuits so as to form the plurality of voltage islands, and wherein the wiring layer is configured to segment the signal inputs and outputs to one or more of the pre-designed chip circuits from the signal inputs and outputs to at least one other of the pre-designed chip circuits.

2. The structure of claim 1, wherein the chips, chip macros or at least one chip in combination with at least one chip macro are assembled on the carrier platform in one or more of a single layer configuration and a stacked configuration.

3. The structure of claim 1, wherein each of the conductive vias comprise one or more of tungsten, copper, nickel, doped-polysilicon and a composite conductor.

4. The structure of claim 1, wherein the chips, chip macros or at least one chip in combination with at least one chip macro are assembled on the carrier platform via one or more individual carriers.

5. The structure of claim 1, wherein the chips, chip macros or at least one chip in combination with at least one chip macro are bonded to the carrier platform using one or more of copper-to-copper bonds, solder bonds and conductive adhesives bonds.

6. The structure of claim 5, wherein the bonds further comprise one or more of an epoxy adhesive, a high temperature adhesive and a polyimide-based adhesive.

7. The structure of claim 5, wherein the bonds are reversible.

8. The structure of claim 5, wherein the bonds have a pitch of between about 20 micrometers and about 50 micrometers.

9. The structure of claim 1, wherein the substrate comprises one or more of an organic material, a glass material, a ceramic material, a glass-ceramic material, alumina and a semiconductor material.

10. The structure of claim 1, wherein the substrate comprises silicon or silicon germanium.

11. The structure of claim 1, wherein the carrier platform comprises one or more of silicon, silicon germanium and gallium arsenide.

12. The structure of claim 1, further comprising a passivation layer between one or more of the chips, chip macros or at least one chip in combination with at least one chip macro and the carrier platform.

13. The structure of claim 12, wherein the passivation layer comprises a polymer material having a coefficient of thermal expansion of between about 25 ppm/° C. and about 60 ppm/° C.

14. The structure of claim 13, wherein the polymer material comprises filled polymers, epoxy-based polymers or polyimide-based polymers.

* * * * *